United States Patent
Lee et al.

(10) Patent No.: US 7,948,032 B2
(45) Date of Patent: May 24, 2011

(54) POWER MOS TRANSISTOR DEVICE AND LAYOUT

(75) Inventors: Hsin-Ming Lee, Hsinchu (TW); Chih-Heng Chang, Kaohsiung County (TW)

(73) Assignee: Novatek Microelectronics Corp., Hsinchu (TW)

( * ) Notice: Subject to any disclaimer, the term of this patent is extended or adjusted under 35 U.S.C. 154(b) by 343 days.

(21) Appl. No.: 12/122,722

(22) Filed: May 19, 2008

(65) Prior Publication Data

US 2009/0189220 A1     Jul. 30, 2009

(30) Foreign Application Priority Data

Jan. 30, 2008   (TW) ................................ 97103467 A

(51) Int. Cl.
*H01L 29/78* (2006.01)
(52) U.S. Cl. ................. 257/341; 257/E29.256
(58) Field of Classification Search ........... 257/E29.256, 257/341
See application file for complete search history.

(56) References Cited

U.S. PATENT DOCUMENTS

| | | | | |
|---|---|---|---|---|
| 5,192,989 A * | 3/1993 | Matsushita et al. | ........... | 257/342 |
| 5,635,742 A * | 6/1997 | Hoshi et al. | .................... | 257/337 |
| 5,682,048 A * | 10/1997 | Shinohara et al. | ............ | 257/342 |
| 5,714,784 A * | 2/1998 | Ker et al. | ....................... | 257/360 |
| 6,097,066 A * | 8/2000 | Lee et al. | ....................... | 257/355 |
| 6,388,292 B1 * | 5/2002 | Lin | ................................ | 257/356 |
| 6,713,822 B2 * | 3/2004 | Shimoji | ........................ | 257/401 |
| 6,798,022 B1 * | 9/2004 | Kuroda et al. | .................. | 257/360 |
| 6,946,706 B1 * | 9/2005 | Brisbin et al. | ................. | 257/343 |
| 7,473,974 B2 * | 1/2009 | Furuta | ............................ | 257/360 |
| 7,652,338 B2 * | 1/2010 | Sutardja | ......................... | 257/401 |
| 2006/0267110 A1 * | 11/2006 | Chen | ............................ | 257/401 |

\* cited by examiner

*Primary Examiner* — Jerome Jackson, Jr.
*Assistant Examiner* — Paul A Budd
(74) *Attorney, Agent, or Firm* — Jianq Chyun IP Office

(57) ABSTRACT

A power metal-oxide semiconductor (MOS) transistor device is provided. The power MOS transistor device includes a drain region disposed in a substrate, a gate structure layer disposed over the substrate, and enclosing a periphery of the drain region, and a source region formed in the substrate and distributed at an outer periphery of the gate structure layer. In addition, the MOS transistor device can, for example, form a transistor array.

4 Claims, 6 Drawing Sheets

POWER MOS TRANSISTOR DEVICE AND LAYOUT

CROSS-REFERENCE TO RELATED APPLICATION

This application claims the priority benefit of Taiwan application serial no. 97103467, filed on Jan. 30, 2008. The entirety of the above-mentioned patent application is hereby incorporated by reference herein and made a part of specification.

BACKGROUND OF THE INVENTION

1. Field of the Invention

The present invention relates to a semiconductor device. More particularly, the present invention relates to a power metal-oxide semiconductor (MOS) transistor technique.

2. Description of Related Art

A conventional MOS transistor layout is required to have an electrostatic protection ability for electrostatic discharge (ESD) when being applied to a power management circuit, in which a relatively large drain and source thereof are designed for bearing excessive currents and the ESD. However, this may lead to a poor integration of the MOS transistor layout. Moreover, excessively large metal wires connected between the drain and the source may also lead to an excessive voltage drop and excessive layout area.

FIG. 1 is a schematic diagram illustrating a layout of a conventional power MOS transistor. Referring to FIG. 1, the power MOS transistor 102 has a plurality of strip-shape gate structure layers 104 disposed on a substrate 100. A drain region 108 and a source region 106 are respectively allocated on the substrate 100 at both sides of the gate structure layer 104. By such means, the plurality of strip-shape transistors is connected in series to achieve the layout of the power MOS transistor, and functions as a current driving device. Such device includes a vertical redundant gate structure layer 104, and excessive length of a finger-shape metal wire used for connecting the drain region 108 and the source region 106 may lead to an excessive voltage drop and deviations of fabrication features of the devices thereof. Therefore, the metal MOS transistor may have poor features.

FIG. 2 is a schematic diagram illustrating a layout of a conventional power MOS transistor with ESD protection ability. Referring to FIG. 2, since the drain region 108 is required to bear a relatively large voltage generated by the ESD, a distance between a contact hole and a gate of the drain region 108 is enlarged, and meanwhile a metal wire connected to the drain region 108 is also enlarged. Relatively, size of the source region 106 is maintained unchanged, and therefore a width thereof is less than that of the drain region 108. By such means, affordability of the metal MOS transistor for the ESD is improved. However, such method requires a relatively large layout area.

Therefore, how to achieve a sufficient affordability for the ESD with a relatively small layout area is still an issue under development.

SUMMARY OF THE INVENTION

Accordingly, the present invention is directed to a power MOS transistor device and a layout thereof, which have an ESD protection function.

The present invention provides a power MOS transistor device including a drain region disposed in a substrate, a gate structure layer disposed on the substrate and enclosing a periphery of the drain region, and a source region formed in the substrate and distributed at an outer periphery of the gate structure layer.

The present invention provides a power MOS transistor structure including a first transistor device and a second transistor device. The first transistor device includes a first drain region disposed in a substrate, a first gate structure layer disposed on the substrate and enclosing a periphery of the first drain region, and a first source region formed in the substrate and distributed at an outer periphery of the first gate structure layer. The second transistor device is disposed adjacent to the first transistor device and includes a second drain region disposed in the substrate, a second gate structure layer disposed on the substrate and enclosing a periphery of the second drain region, and a second source region formed in the substrate and distributed at an outer periphery of the second gate structure layer.

The present invention provides a power MOS transistor layout including a plurality of transistor units forming a transistor array. The transistor array at least includes a first transistor device and a second transistor device. The first transistor device includes a first drain region disposed in a substrate, a first gate structure layer disposed on the substrate and enclosing a periphery of the first drain region, and a first source region formed in the substrate and distributed at an outer periphery of the first gate structure layer. The second transistor device is disposed adjacent to the first transistor device and includes a second drain region disposed in a substrate, a second gate structure layer disposed on the substrate and enclosing a periphery of the second drain region, and a second source region formed in the substrate and distributed at an outer periphery of the second gate structure layer.

In an embodiment of the present invention, the first and the second gate structure layers respectively include a gate dielectric layer and a gate layer.

In an embodiment of the present invention, the first source area continuously or discontinuously encloses an outer periphery of the first gate structure layer.

In an embodiment of the present invention, a base region is further included, and is disposed adjacent to the first source region and the second source region, and is located at a periphery of the first and the second source regions.

In an embodiment of the present invention, the first transistor device and the second transistor device commonly utilize the base region.

In an embodiment of the present invention, the first gate structure layer and the second gate structure layer are connected.

In an embodiment of the present invention, a joint of the first gate structure layer and the second gate structure layer has at least a contact structure.

In an embodiment of the present invention, shapes of the drain regions are quadrangles.

In an embodiment of the present invention, shapes of the drain regions are squares or rectangles.

In order to make the aforementioned and other objects, features and advantages of the present invention comprehensible, a preferred embodiment accompanied with figures is described in detail below.

DESCRIPTION OF EMBODIMENTS

According to the present invention, at least a problem of voltage drop caused by excessive resistance generated when a transistor current flows through an excessive length of source or drain thereof due to applying of a grid-shape (finger-shape) layout of a conventional MOS transistor may be solved.

The present invention may, for example, reduce the voltage drop generated due to excessive length of the MOS transistor, and improve an ESD protection ability of the MOS transistor, by which a protection ring may still be maintained without increasing excessive source and drain areas, so as to achieve the ESD protection ability.

In the following content, embodiments are provided for describing the spirit of the present invention, though the present invention is not limited to the provided embodiments. Moreover, the embodiments may be combined with each other, and the present invention is not limited to an individual embodiment.

Figure 1:
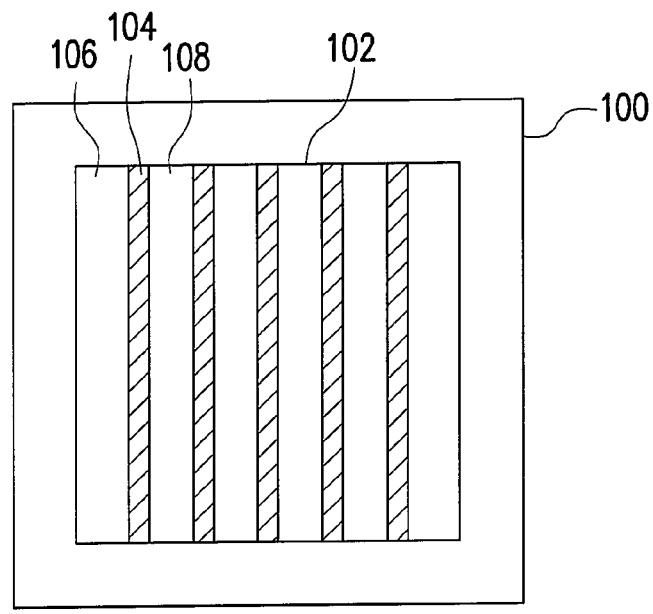
FIG. 1 is a schematic diagram illustrating a layout of a conventional power MOS transistor.
Figure 2:
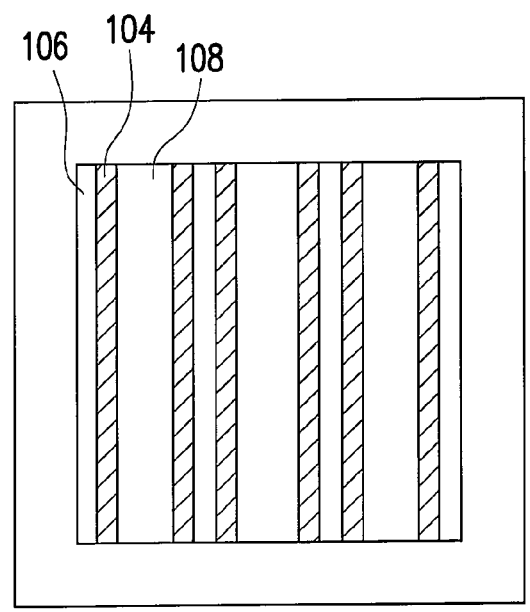
FIG. 2 is a schematic diagram illustrating a layout of a conventional power MOS transistor with ESD protection ability.
Figure 3:
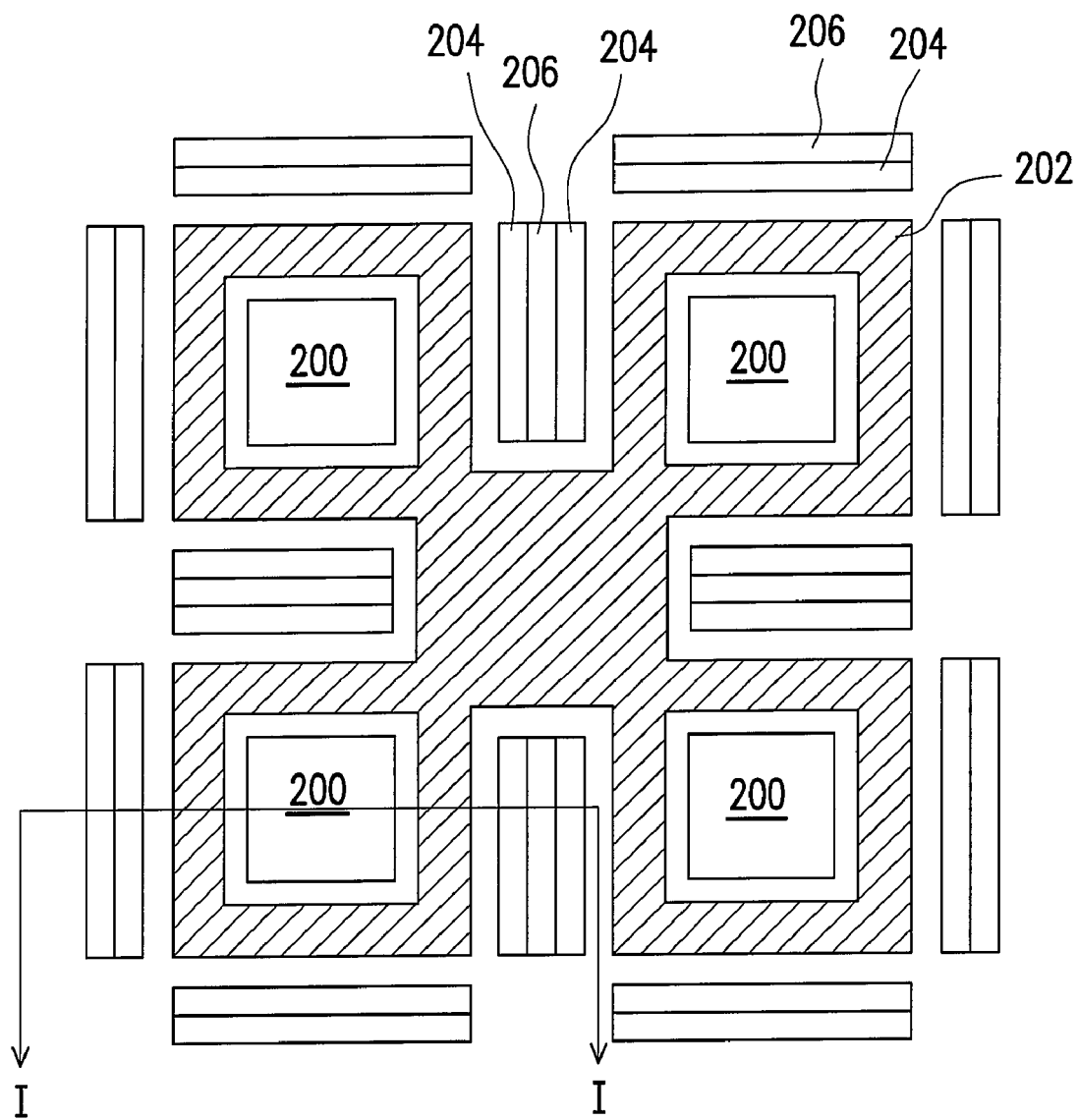
FIG. 3 is a schematic diagram illustrating a layout of a power MOS transistor unit according to an embodiment of the present invention.
Figure 4:
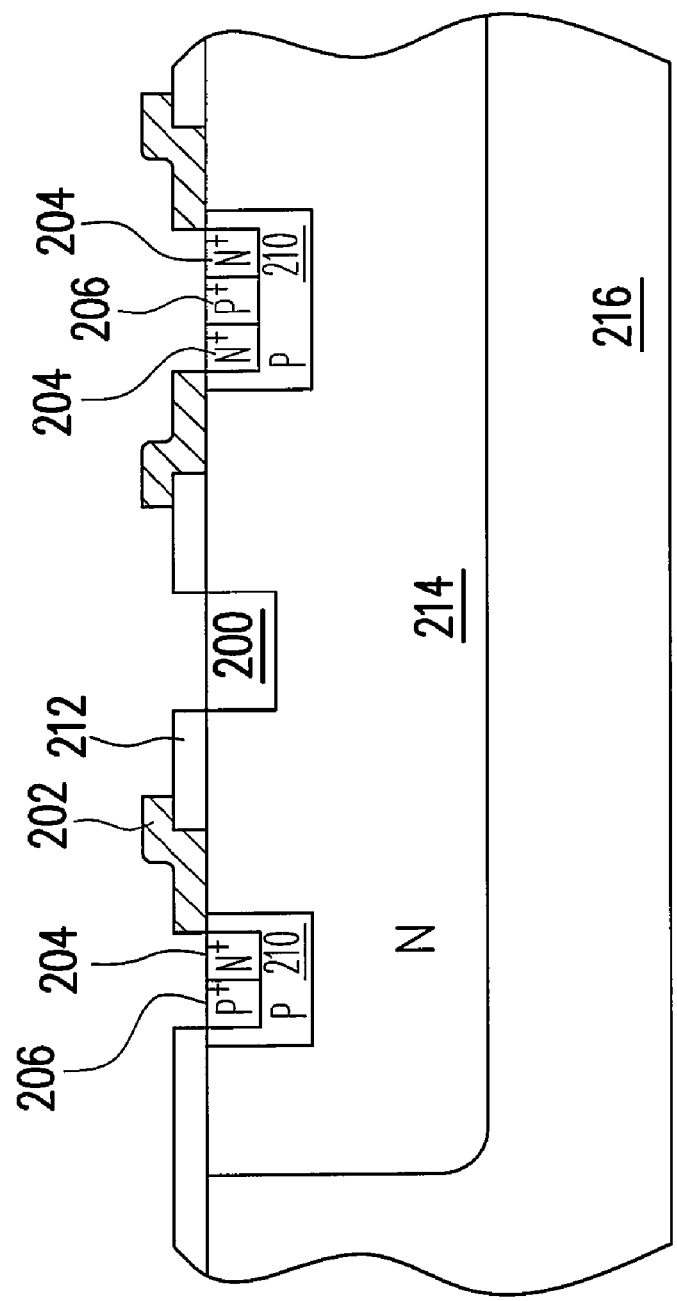
FIG. 4 is a cross-sectional view of a single MOS transistor of FIG. 3 according to an embodiment of the present invention.

FIG. 3 is a schematic diagram illustrating a layout of a power MOS transistor unit according to an embodiment of the present invention. FIG. 4 is a cross-sectional view of a single MOS transistor of FIG. 3 according to an embodiment of the present invention. Referring to FIG. 3 and FIG. 4, as to the layout thereof, a basic unit may be, for example, composed of four MOS transistor devices, and a plurality of the basic units may form a matrix. In the present embodiment, four drain areas 200 of the four MOS transistor devices are arranged in a 2×2 array with a shape of regular quadrangle or regular rectangle. However, the present invention is not limited thereto, and a shape of roundness or other suitable regular shapes may also be applied.

To gain the ESD protection ability, in the present embodiment, as to a single MOS device, a gate structure layer 202+212, a source region 204 and a base region 206 thereof may be, for example, arranged in a layout of enclosing a periphery of the drain region 200. Namely, the gate structure layer 202+212 approximately encloses the drain region 200, the source region 204 is approximately distributed at an outer periphery of the gate structure layer 202+212, and the base region 206 is disposed around a periphery of the source region 204. Wherein, the source region 204 and the base region 206 are connected via a metal leading wire (not shown) based on a butting rule. Moreover, as shown in FIG. 3, the base region 206 is located between two source regions 204 of two adjacent MOS devices, and therefore two adjacent MOS devices share the base region 206. The source region 204 and the base region 206 connected between two gate structure layers 202 have at least one contact for connecting to an external circuit. Moreover, the drain region 200 also has at least one contact for connecting to the external circuit.

As shown in FIG. 4, the drain region 200 is located in a substrate 216. It should be noted that if the above MOS device is a complementary MOS (CMOS) device, as shown in FIG. 4, a doped well 214 is further included to form the power MOS transistor. The gate structure layer 202+212 is located on the substrate 216, which continuously or discontinuously encloses a periphery of the drain region 200. The gate structure layer is formed by stacking a gate layer 202 and a gate dielectric layer 212. The source region 204 is formed on the substrate 216 and is distributed at an outer periphery of the gate layer 202.

In the present embodiment, the source region 204 is a discontinuous structure enclosing an outer periphery of the gate structure layer, though the present invention is not limited thereto. Actually, the source region 204 may also be a continuous structure (as shown as FIG. 5). The base region 206 is disposed adjacent to the source region 204, and is located at an outer periphery of the source region 204. A P type doped region 210 is located below the base region 206 and the source region 204. As described above, the two adjacent MOS devices share the base region 206 therebetween, so that an area of the utilized devices may be reduced.

Figure 5:
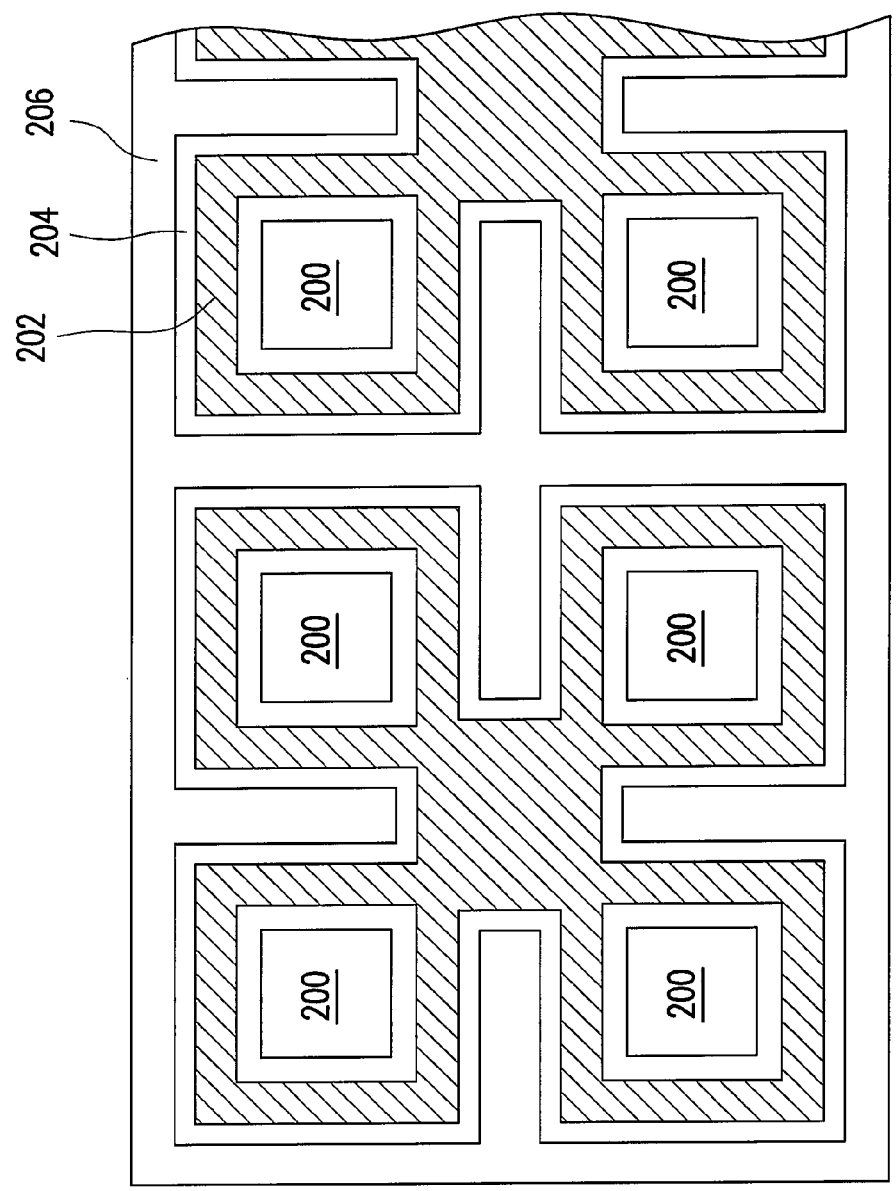
FIG. 5 is schematic diagram illustrating a layout of a power MOS transistor unit according to another embodiment of the present invention.

FIG. 5 is schematic diagram illustrating a layout of a power MOS transistor unit according to another embodiment of the present invention. Referring to FIG. 5, layouts of the drain region 200 and the gate layer 202 of the present embodiment are similar to that of the embodiment of FIG. 3, a main difference therebetween is that a structure of the source region 204 and the base region 206 of the present embodiment is a continuous structure, which is different from the discontinuous structure of the embodiment shown as FIG. 3.

Moreover, as to a layout of the gate layer 202, number of the MOS transistor devices used for forming the basic unit is not limited to four. In other words, taking a single MOS device as a base, the basic unit may be formed by two or at least two MOS devices, and a shape thereof is preferably suitable for a relatively large area arrangement.

Figure 6:
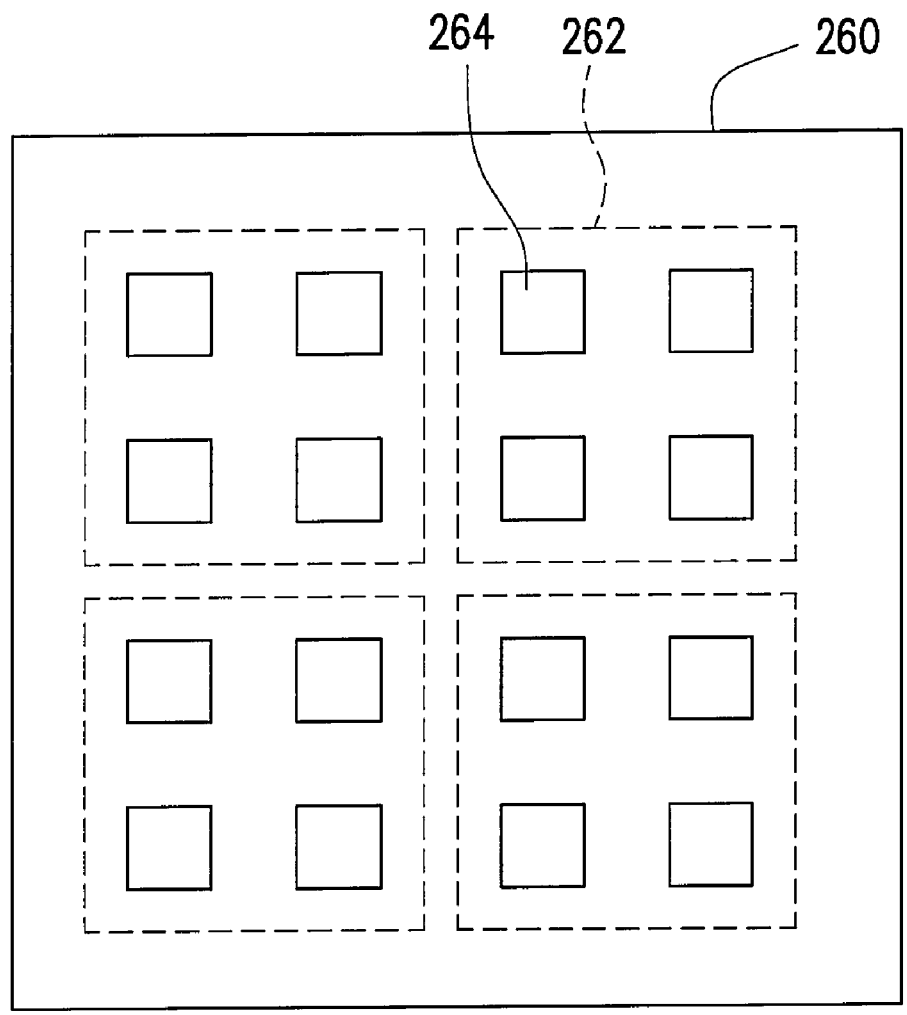
FIG. 6 is a schematic diagram illustrating a large area layout of a power MOS transistor according to an embodiment of the present invention.

FIG. 6 is a schematic diagram illustrating a large area layout of a power MOS transistor according to an embodiment of the present invention. Referring to FIG. 6, based on the single MOS device, a basic unit 262 is, for example, formed by four MOS devices 264, so as to form a layout 260 of the power MOS transistor with the relatively large area for increasing the ESD protection ability thereof.

Figure 7:
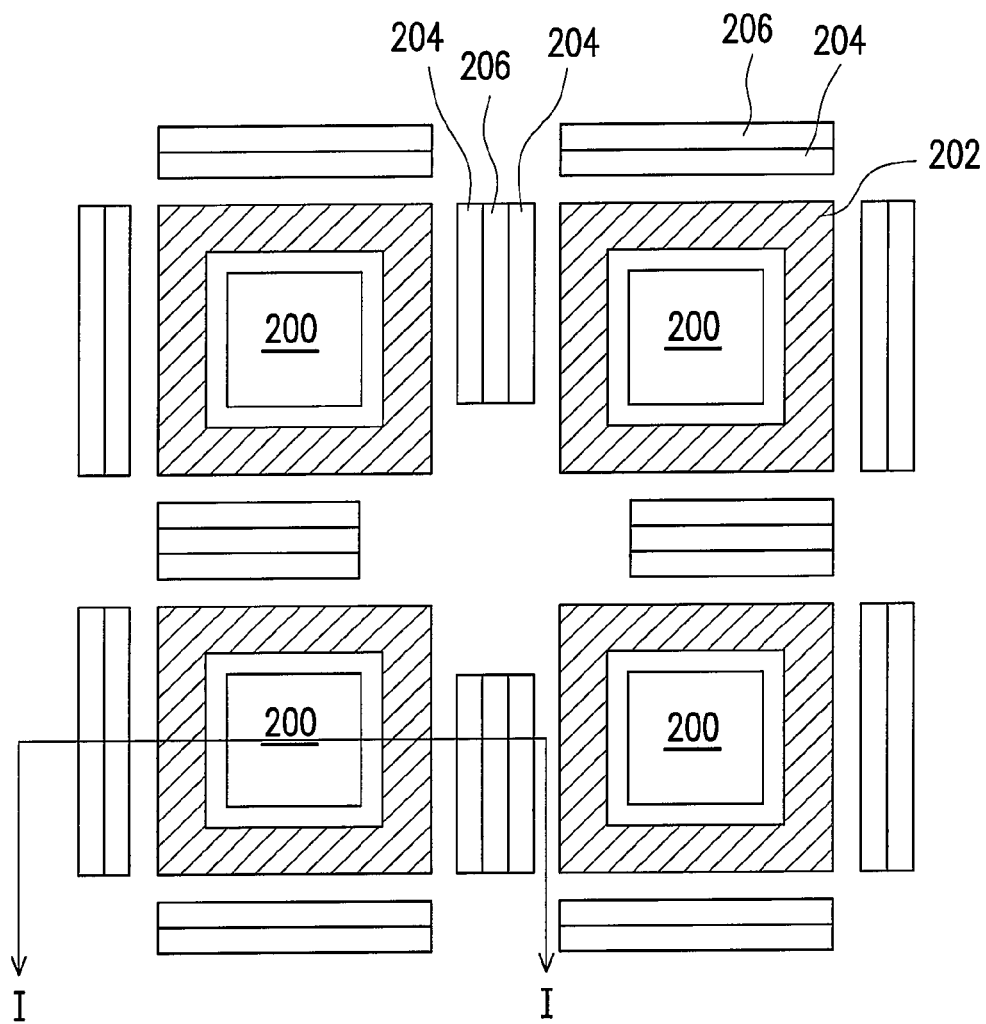
FIG. 7 is a schematic diagram illustrating a layout of a power MOS transistor unit according to an embodiment of the present invention.

Moreover, the aforementioned embodiments are only used for examples, and are not intended to limit the present invention. According to an actual requirement, based on a same design principle, various modifications and variations can be made to the structure of the present invention. FIG. 7 is a schematic diagram illustrating a layout of a power MOS transistor unit according to an embodiment of the present invention. Referring to FIG. 7, a structure thereof is designed based on variation of the structure shown in FIG. 3. The layout of the gate layer 202 is still designed to enclose the individual drain region 200. But the four drain regions 200 do not need to be connected to each other. The individual drain region 200 may, for example, further correspond to the individual gate layer 202. In other words, the individual drain region 200 and the gate layer 202 may individually form a unit for utilization.

In the present embodiment, based on butting of the source and the base, each of the MOS transistors has a perfect base protection ring for improving a device performance thereof. Moreover, the source and the base may be connected via an interconnect metal layer for enhancing a discharging ability of the ESD (ESD protection). In addition, the drain and the source may apply a relatively wider upper metal wire to function as an external leading wire, which may be applied to devices requiring relatively great currents and voltages.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power metal-oxide semiconductor (MOS) transistor device, comprising:
    four drain regions, disposed in a substrate;
    a gate structure layer, disposed on the substrate, and enclosing a periphery of each of the drain regions, wherein the gate structure layer comprises:
        four peripheral regions, respectively enclosing the four drain regions; and
        one center region, located between the four peripheral regions, wherein the center region is a quadrangle having four corners to directly connect to the four peripheral regions; and
    a source region, disposed in the substrate, and distributed at an outer periphery of the gate structure layer, wherein the source region continuously or discontinuously encloses the gate structure layer, and the center region of the gate structure layer has no portion of the source region.

2. The power MOS transistor device as claimed in claim 1, wherein the gate structure layer includes a stacked gate dielectric layer and a gate layer.

3. The power MOS transistor device as claimed in claim 1 further comprising a base region disposed adjacent to the source region and located at a periphery of the source region.

4. The power MOS transistor device as claimed in claim 3, wherein the base region is shared by an adjacent power MOS device.

* * * * *